US008940195B2

(12) United States Patent
Lee et al.

(10) Patent No.: US 8,940,195 B2
(45) Date of Patent: *Jan. 27, 2015

(54) CONDUCTIVE PASTE, AND ELECTRONIC DEVICE AND SOLAR CELL INCLUDING AN ELECTRODE FORMED USING THE SAME

(75) Inventors: Eun Sung Lee, Seoul (KR); Se Yun Kim, Seoul (KR); Sang Soo Jee, Hwaseong-si (KR); Yong Nam Ham, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 273 days.

This patent is subject to a terminal disclaimer.

(21) Appl. No.: 13/307,932

(22) Filed: Nov. 30, 2011

(65) Prior Publication Data

US 2012/0180859 A1 Jul. 19, 2012

(30) Foreign Application Priority Data

Jan. 13, 2011 (KR) .................. 10-2011-0003675
Jul. 27, 2011 (KR) .................. 10-2011-0074690

(51) Int. Cl.
*H01B 1/02* (2006.01)
*H01B 1/22* (2006.01)
*H01L 31/0224* (2006.01)

(52) U.S. Cl.
CPC .......... *H01L 31/022425* (2013.01); *H01B 1/22* (2013.01); *Y02E 10/50* (2013.01)
USPC ............ 252/512; 252/510; 252/513; 252/514; 252/519.2; 106/31.92; 136/224; 136/256; 174/126.1

(58) Field of Classification Search
CPC ....................................................... H01B 1/22
USPC ............ 252/510, 512–514, 519.2; 136/244, 136/256, 224; 174/126.1; 106/31.92
See application file for complete search history.

(56) References Cited

U.S. PATENT DOCUMENTS

| 4,434,084 A | 2/1984 | Hicks et al. |
| 4,962,066 A | 10/1990 | Starz |
| 5,170,930 A | 12/1992 | Dolbear et al. |

(Continued)

FOREIGN PATENT DOCUMENTS

| CN | 101055776 A | 10/2007 |
| CN | 101186128 A | 5/2008 |

(Continued)

OTHER PUBLICATIONS

Se Yun Kim et al. "Replacement of oxide glass with metallic glass for Ag screen printing metallization on Si emitter," *App. Phys. Lett.*, Am. Inst. Phys., vol. 98, No. 222112 Jun. 3, 2011).

(Continued)

*Primary Examiner* — Khanh Tuan Nguyen
(74) *Attorney, Agent, or Firm* — Harness, Dickey & Pierce, PLC

(57) ABSTRACT

A conductive paste includes a conductive powder, a metallic glass, and an organic vehicle. The metallic glass includes a first element, a second element having a higher absolute value of Gibbs free energy of oxide formation than the first element, and a third element having an absolute value of Gibbs free energy of oxide formation of about 1000 kJ/mol or less at a baking temperature and a eutectic temperature with the conductive powder of less than about 1000° C. An electronic device and a solar cell may include an electrode formed using the conductive paste.

20 Claims, 5 Drawing Sheets

(56) References Cited

U.S. PATENT DOCUMENTS

| | | | |
|---|---|---|---|
| 6,027,575 | A | 2/2000 | Paruchuri et al. |
| 6,420,067 | B1 | 7/2002 | Yoshioka |
| 7,056,394 | B2 | 6/2006 | Inoue et al. |
| 7,147,727 | B2 | 12/2006 | Kim et al. |
| 7,183,018 | B2 | 2/2007 | Kawakami et al. |
| 7,399,370 | B2 | 7/2008 | Inoue et al. |
| 7,947,134 | B2 | 5/2011 | Lohwongwatana et al. |
| 2002/0036034 | A1 | 3/2002 | Xing et al. |
| 2004/0245507 | A1 | 12/2004 | Nagai et al. |
| 2005/0019203 | A1 | 1/2005 | Saitoh et al. |
| 2005/0211340 | A1 | 9/2005 | Kim et al. |
| 2005/0228097 | A1 | 10/2005 | Zhong |
| 2006/0102228 | A1 | 5/2006 | Sridharan et al. |
| 2007/0031730 | A1 | 2/2007 | Kawakami et al. |
| 2007/0034305 | A1 | 2/2007 | Suh |
| 2007/0072969 | A1 | 3/2007 | Lee et al. |
| 2007/0102676 | A1 | 5/2007 | Lee et al. |
| 2007/0137737 | A1 | 6/2007 | Guo et al. |
| 2007/0157852 | A1 | 7/2007 | Lee et al. |
| 2008/0196794 | A1 | 8/2008 | Blandin et al. |
| 2009/0056798 | A1 | 3/2009 | Merchant et al. |
| 2009/0101190 | A1* | 4/2009 | Salami et al. .......... 136/244 |
| 2009/0211626 | A1 | 8/2009 | Akimoto |
| 2009/0250106 | A1 | 10/2009 | Hayashi et al. |
| 2009/0298283 | A1 | 12/2009 | Akimoto et al. |
| 2010/0037990 | A1 | 2/2010 | Suh |
| 2010/0096014 | A1 | 4/2010 | Iida et al. |
| 2010/0098840 | A1 | 4/2010 | Du et al. |
| 2010/0101637 | A1 | 4/2010 | Yamasaki et al. |
| 2011/0114170 | A1* | 5/2011 | Lee et al. .......... 136/256 |
| 2011/0162687 | A1 | 7/2011 | Moon et al. |
| 2012/0031481 | A1 | 2/2012 | Jee et al. |
| 2012/0103409 | A1 | 5/2012 | Kim et al. |

FOREIGN PATENT DOCUMENTS

| | | |
|---|---|---|
| CN | 101359564 A | 2/2009 |
| EP | 1039568 B1 | 9/1999 |
| EP | 2325848 A2 | 5/2011 |
| EP | 2416327 A1 | 2/2012 |
| EP | 2448003 A2 | 5/2012 |
| EP | 2450908 A2 | 5/2012 |
| JP | 62-062870 | 3/1987 |
| JP | 10-040738 A | 2/1998 |
| JP | 10144139 A | 5/1998 |
| JP | 2000-311681 A | 11/2000 |
| JP | 2002-080902 A | 3/2002 |
| JP | 2002298651 A | 10/2002 |
| JP | 2003-013103 A | 1/2003 |
| JP | 2003003246 A | 1/2003 |
| JP | 2004091868 A | 3/2004 |
| JP | 2005050983 A | 2/2005 |
| JP | 2008010527 A | 1/2008 |
| JP | 2010-018878 | 1/2009 |
| JP | 2009-099371 | 5/2009 |
| JP | 2009-138266 | 6/2009 |
| JP | 2009197323 A | 9/2009 |
| JP | 2010133021 A | 6/2010 |
| JP | 2010199196 A | 9/2010 |
| KR | 2002-0037772 | 5/2002 |
| KR | 1020050087249 A | 8/2005 |
| KR | 1020050096258 A | 10/2005 |
| KR | 10-0677805 B | 1/2007 |
| KR | 1020070106887 A | 11/2007 |
| WO | WO 01/31085 | 5/2001 |
| WO | WO-2005/096320 A2 | 10/2005 |
| WO | WO 2005096320 A2 | 10/2005 |
| WO | WO 2009108675 A1 | 9/2009 |
| WO | WO 2010033281 | 3/2010 |

OTHER PUBLICATIONS

Mohamed M. Hilali et al., "Effect of Ag Particle Size in Thick-Film Ag Paste on the Electrical and Physical Properties of Screen Printed Contacts and Silicon Solar Cells," *J. Electromech. Soc.* vol. 153, No. 1, pp. A5-A11 (2006).

ASM Handbook. vol. 3 Alloy Phase Diagrams, *The Materials Information Soc.*, Hugh Baker, Ed., ASM International (1992).

US Office Action dated Dec. 10, 2012 corresponding to U.S. Appl. No. 13/016,403.

Partial European Search Report for 10190652.7-2102 dated Mar. 23, 2011.

European Search Report for 11177515.1.1218 dated Feb. 5, 2013.

European Search Report dated Dec. 20, 2011.

Lin et al., "Effect of Ni on glass-forming ability og Cu—Ti-based amorphous alloys", 2006, Transactions of Nonferrous Metals Society of China, 16, pp. 604-606.

Wang X et al.: "Atomic structure and glass formig ability of Cu46Zr46A18 bulk metallic glass", J. Appl. Phys. 104, 093519 (2008).

Arai et al., "Nanocrystal Formation of Metals in Thermally Grown Thin Silicon Dioxide Layer by Ion Implantation and Thermal Diffusion of Implanted Atoms in Heat Treatment", J. Phys. Conf., Ser. 61, 2007; 41-45.

Powell et al., Development of metallic glass loaded polymer paste, J. of Materials Processing Tech., 2001, pp. 318-323.

Schubert, G. et al., "Silver thick film contact formation on lowly doped phosphorous emitters", 2005, Proceedings 20th EPVSEC, Barcelona, pp. 934-937.

Kim S J et al: "Silver/metallic glass paste for shallow emitter Si-solar cell", 26th European Photovoltaic Solar Energy Conference and Exhibition, Sep. 5-9, 2011, pp. 492-494, XP009160654.

Lee S-W et al: "Design of a bulk amorphous alloy containing Cu—Zr with simultaneous improvement in glass-forming ability and plasticity", Journal of Materials Research, vol. 22, No. 02, Feb. 2007, pp. 486-492, XP55031306.

Kim Y C et al: "Enhanced glass forming ability and mechanical properties of new Cu-based bulk metallic glasses", Materials Science and Engineering A: Structual Materials: Properties, Microstructure & Processing, Lausanne, CH, vol. 437, No. 2, Nov. 15, 2006, pp. 248-253, XP027953056.

Neuhaus D-H et al: "Industrial Silicon Wafer Solar Cells", Advance in Optoelectronics, vol. 2007, XP 55031298.

Bashev V F et al: "Crystallization of Al—Ni alloys during rapid cooling", Russian Metallurgy, Allerton Press, Inc, No. 6, 1989, pp. 51-54, XP009160582.

Ivanov E et al: "Synthesis of nickel aluminides by mechanical alloying", Materials Letters, North Holland Publishing Company, Amsterdam, NL, vol. 7, No. 1-2, Aug. 1988, pp. 51-54, XP024149792.

Lim S S et al: "Assessment of the Al—Ag Binary Phase Diagram", CALPHAD, vol. 19, No. 2, 1995, pp. 131-141, XP55017954.

Wang Q et al: "Cluster line criterion and Cu—Zr—Al bulk metallic glass formation", Materials Science and Engineering A: Structural Materials: Properties, Microsturcture & Processing, Lausanne, CH, vol. 449-451, Mar. 19, 2007, pp. 18-23, XP005914563.

Metallurgy Division of the Materials Science and Engineering Laboratory of NIST: "Ag—Cu—Sn System", Aug. 5, 2010, XP55031251, Retrieved from the Internet: http://web.archive.org/web/20100805072225/http://www.metallurgy.nist.gov/phase/solder/agcusn.html.

Oh C-S et al: "A thermodynamic study on the Ag—Sb—Sn system", Journal of alloys and compounds, elsevier sequoia, lausanne, CH, vol. 238, May 1, 1996, pp. 155-166, XP004080478.

Baren M R: "Ag—In (Silver—Indium)" In: White C E T, Okamoto H (Editors): "Phase Diagrams of Indium Alloys and their engineering applications", 1992, ASM International, Materials Park, XP008098250.

Gorshkov N N et al: "Explosive compaction of amorphous Cu—Sn powder prepared by the method of mechanical alloying", Combustion, Explosion, and shock waves, vol. 25, No. 2, 1989, pp. 244-247.

Salkar R A et al: "The sonochemical preparation of amorphous silver nanoparticles", Journal of materials chemistry, vol. 9, No. 6, 1999, pp. 1333-1335.

(56) References Cited

OTHER PUBLICATIONS

"Amorphous metal", Wikipedia, Oct. 21, 2010, XP55017848, Retrieved from the internet: URL: http://en.wikipedia.org/w/index.php?title=amorphous metal&oldid=392080524.

"Electrical resistivity of pure metals" in: "CRC Handbook of chemistry and physics, 77th edition", 1996, CRC Press, Boca raton, New york, London, Tokyo, XP002668350.

US Office Action dated May 15, 2013 corresponding to U.S. Appl. No. 13/016,403.

US Office Action dated Jun. 5, 2013 corresponding to U.S. Appl. No. 12/943,732.

NIST, Properties of Lead-Free Solders, Release 4.0, Feb. 2002.

Notice of Allowance mailed Jun. 12, 2013, issued in related U.S. Appl. No. 13/208,705.

US Office Action dated Oct. 8, 2013 corresponding to U.S. Appl. No. 13/281,835.

US Office Action dated Aug. 23, 2013 corresponding to U.S. Appl. No. 13/016,403.

US Office Action dated Oct. 23, 2013 corresponding to U.S. Appl. No. 12/943,732.

Don-Ik Lee, et al., "Effect of TRITON™ X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).

Don-Ik Lee, et al., "Plasma Display Material Prepared from a New Blue Phosphor Dispersion" Journal of Applied Polymer Science, vol. 108, 2571-2577 (2008).

Don-Ik Lee, et al., "Synthesis and Characterization of TRITON™ X-Based Surfactants with Carboxylic or Amino Groups in the Oxyethylene Chain End", Journal of Applied Polymer Science, vol. 104, 162-170 (2007).

M. Chen, "A brief overview of bulk metallic glasses", NPG Asia Materials, vol. 3, Step. 2011, pp. 82-90.

Reda, I.M., et al., "Amorphous Cu—Ag Films With High Stability," International Centre for Theoretical Physics, 1982.

Yi, S. et al. "Ni-based bulk amorphous alloys in the Ni—Ti—Zr—(Si,Sn) system"; Journal of Materials Research, vol. 15, No. 11, p. 2425-2430; Nov. 2000.

Wang, W. "Roles of minor additions in formation and properties of bulk metallic glasses" Progress in Materials Science, vol. 52 p. 540-596; 2007.

Kenneth Barbalace. Periodic Table of Elements—Sorted by Atomic Radius. EnvironmentalChemistry.com. 1995 http://EnvironmentalChemistry.com/yogi/periodic/atomicradius.html.

US Office Action dated Jan. 31, 2014 corresponding to U.S. Appl. No. 13/348,169.

Office Action dated Apr. 25, 2014 for corresponding U.S. Appl. No. 13/206,880.

Office Action dated May 1, 2014 for corresponding U.S. Appl. No. 12/943,732.

Office Action dated May 2, 2014 for corresponding U.S. Appl. No. 13/281,835.

Hilali et al., "Effect of glass frit chemistry on the physical and electrical properties of thick-film Ag contacts for silicon solar cells", Journal of Electronic Materials. vol. 35, Issue 11, pp. 2041-2047, 2008.

Rane et al., "Effect of inorganic binders on the properties of silver thick films", Journal of Materials Science: Materials in Electronics, vol. 15, Issue 2, pp. 103-106; 2004.

Busch et al., "Viscosity of the supercooled liquid and relaxation at the glass transition of the bulk metallic glass forming alloy", Acta Materialia, vol. 46, Issue 13, pp. 4725-4732; 1998.

Kuo et al., "Measurement of low-temperature transport properties of Cu-based Cu—Zr—Ti bulk metallic glass", Physical Review B, vol. 74, pp. 014208-1 to 014208-7; 2006.

Japanese Office Action dated Apr. 1, 2014 for corresponding application No. JP 2010-252993.

Zhang et al. "Thermal and Mechanical Properties of Ti—Ni—Cu—Sn Amorphous Alloys with a Wide Supercooled Liquid Region before Crystallization"; Materials Transactions, vol. 39, p. 1001-1006; 1998.

Chinese Office Action dated Jun. 5, 2014 for corresponding Chinese application No. 201010544709, and English-language translation.

Final Office Action for corresponding U.S. Appl. No. 13/206,880 dated Oct. 14, 2014.

\* cited by examiner

CONDUCTIVE PASTE, AND ELECTRONIC DEVICE AND SOLAR CELL INCLUDING AN ELECTRODE FORMED USING THE SAME

CROSS-REFERENCE TO RELATED APPLICATION

This application claims priority to and the benefit of Korean Patent Application No. 10-2011-0003675 filed in the Korean Intellectual Property Office on Jan. 13, 2011, and Korean Patent Application No. 10-2011-0074690 filed in the Korean Intellectual Property Office on Jul. 27, 2011, the entire contents of each of which are incorporated herein by reference.

BACKGROUND

1. Field

Example embodiments provide a conductive paste, and an electronic device and a solar cell including an electrode using the same.

2. Description of the Related Art

A solar cell is a photoelectric conversion device that transforms solar energy into electrical energy. Solar cells have attracted attention as a potentially infinite and pollution-free next generation energy source.

A solar cell includes p-type and n-type semiconductors. When an electron-hole pair ("EHP") is produced by light absorbed in a photoactive layer of the semiconductors, the solar cell produces electrical energy by transferring electrons and holes to the n-type and p-type semiconductors, respectively, and then collecting the electrons and holes in electrodes of the solar cell.

A solar cell should desirably have the highest possible efficiency for producing electrical energy from solar energy. In order to improve this efficiency, the solar cell desirably absorbs light with minor loss so that the solar cell may produce as many electron-hole pairs as possible, and collect the produced charges. An electrode of a solar cell is formed by screen printing a conductive paste.

SUMMARY

Example embodiments provide a conductive paste that is capable of ensuring conductivity to decrease undesirable charge loss and improve efficiency of a solar cell. Example embodiments also provide an electronic device including an electrode formed by using the conductive paste. Example embodiments also provide a solar cell including an electrode formed by using the conductive paste.

According to example embodiments, a conductive paste may include a conductive powder, a metallic glass, and an organic vehicle. The metallic glass may include a first element, a second element having a higher absolute value of Gibbs free energy of oxide formation than the first element, and a third element having an absolute value of Gibbs free energy of oxide formation of about 1000 kJ/mol or less at a baking temperature and a eutectic temperature with the conductive powder of less than about 1000° C.

A Gibbs free energy difference of oxide formation between the second element and the third element may be about 300 kJ/mol or more. The first element may have lower resistivity than the second element and the third element. The second element may be introduced to the conductive paste as an oxide. The third element may have a eutectic temperature with the conductive powder of about 200° C. to about 950° C. The conductive paste may have a baking temperature of about 1000° C. or less.

The conductive powder may include at least one of silver (Ag), aluminum (Al), copper (Cu), nickel (Ni), and a combination thereof. The first element may include copper (Cu), and the second element may include zirconium (Zr). The third element may include at least one of zinc (Zn), tin (Sn), antimony (Sb), bismuth (Bi), cadmium (Cd), thallium (Tl), germanium (Ge), indium (In), gallium (Ga), and a combination thereof.

The conductive powder, the metallic glass, and the organic vehicle may be included at about 30 wt % to about 99 wt %, about 0.1 wt % to about 20 wt %, and about 0.9 wt % to about 69.9 wt %, based on the total amount of the conductive paste, respectively.

According to example embodiments, an electronic device may include an electrode including the conductive paste of example embodiments.

According to example embodiments, a solar cell may include an electrode electrically connected with a semiconductor layer, and including the conductive paste of example embodiments.

A Gibbs free energy difference of oxide formation between the second element and the third element may be about 300 kJ/mol or more. The first element may have lower resistivity than the second element and the third element.

The first element may include copper (Cu), and the second element may include zirconium (Zr). The third element may include zinc (Zn), tin (Sn), antimony (Sb), bismuth (Bi), cadmium (Cd), thallium (Tl), germanium (Ge), indium (In), gallium (Ga), or a combination thereof.

The electrode may include a buffer layer at a region adjacent to the semiconductor layer, and an electrode portion at another region different from a region where the buffer layer is formed, the electrode portion including a conductive material.

The second element in the buffer layer may be introduced as an oxide. The conductive material may include at least one of silver (Ag), aluminum (Al), copper (Cu), nickel (Ni), and a combination thereof.

At least one of the buffer layer, the interface of the semiconductor layer and the buffer layer, and the semiconductor layer, may include a crystallized conductive material.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
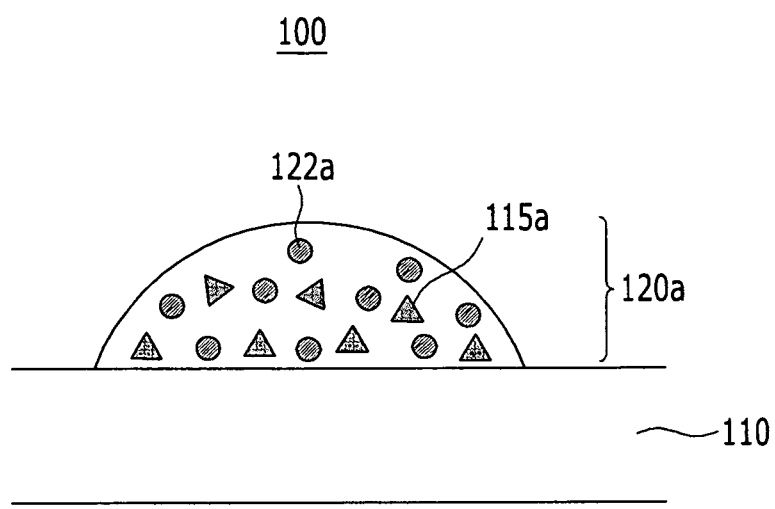
FIGS. 1A to 1D are cross-sectional views sequentially illustrating a conductive structure according to example embodiments including a conductive powder that forms a solid solution with and is diffused into a metallic glass.

Example embodiments will hereinafter be described in further detail with reference to the accompanying drawings, in which various example embodiments are shown. This disclosure may, however, be embodied in many different forms and should not be construed as limited to example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. Hereinafter, the term 'element' refers to a metal and a semimetal.

A conductive paste according to example embodiments includes a conductive powder, a metallic glass, and an organic vehicle. The conductive powder may include at least one of a silver (Ag)-containing metal, e.g., silver or a silver alloy, an aluminum (Al)-containing metal, e.g., aluminum or an aluminum alloy, a copper (Cu)-containing metal, e.g., copper (Cu) or a copper alloy, a nickel (Ni)-containing metal, e.g., nickel (Ni) or a nickel alloy, and a combination thereof. However, the conductive powder is not limited thereto, and may include other metals and an additive other than the metals.

The conductive powder may have a size (e.g., average largest particle size) ranging from about 1 nm to about 50 micrometers ($\mu m$). The metallic glass includes an amorphous alloy having a disordered atomic structure including two or more elements. The metallic glass may be an amorphous metal. The metallic glass has a relatively low resistivity, and thus has relatively low conductivity unlike a glass, e.g., a silicate.

The metallic glass includes a first element having a relatively low resistivity, a second element having a higher absolute value of Gibbs free energy of oxide formation ($\Delta_f G^0$) than the first element, and a third element having an absolute value of Gibbs free energy of oxide formation of about 1000 kJ/mol or less at a baking temperature and having an eutectic temperature with the conductive powder of less than about 1000° C.

The first element, which is a relatively low resistance element, may be a component for determining the conductivity of metallic glass. The first element may have lower resistivity than those of the second element and the third element, and may have resistivity of less than about 100 $\mu\Omega cm$, for example, less than about 15 $\mu\Omega cm$.

The first element may include, for example, at least one of silver (Ag), copper (Cu), gold (Au), aluminum (Al), calcium (Ca), beryllium (Be), magnesium (Mg), sodium (Na), molybdenum (Mo), tungsten (W), zinc (Zn), nickel (Ni), potassium (K), lithium (Li), iron (Fe), palladium (Pd), platinum (Pt), rubidium (Rb), chromium (Cr), and strontium (Sr).

The second element is an element having a higher absolute value of Gibbs free energy of oxide formation than the first element for improving the oxidation resistance of the metallic glass. As the absolute value of Gibbs free energy of oxide formation is higher, the second element may be more easily oxidized. Therefore, the second element may be oxidized faster than the first element when exposed to air.

The conductive paste including the metallic glass is generally processed while being exposed to air, so the conductive paste may be easily exposed to oxygen. When the first element is oxidized, the conductivity of the conductive paste may be deteriorated. The second element is primarily oxidized to provide a stable oxide layer on the surface of the metallic glass by including the second element having a higher oxidizing property than the first element, thereby preventing or inhibiting the oxidization of the first element, and conductivity deterioration of the metallic glass.

The second element may be present as an oxide while baking the conductive paste. For example, the first element may include copper (Cu) and the second element may include zirconium (Zr). The third element is a component that is capable of forming a solid solution of the conductive powder.

The metallic glass may be softened like glass when heated above the glass transition temperature ($T_g$) to show a liquid-like behavior. The metallic glass may be diffused and transferred into the metallic glass in which the conductive powder is softened by including the third component that is capable of forming a solid solution with the conductive powder.

In other words, when the conductive paste including the metallic glass is applied onto the semiconductor substrate to provide an electrode of a solar cell, the metallic glass may be softened by the heating treatment, and the conductive powder may form a solid solution with the third element of the metallic glass, which is also diffused and transferred into the softened metallic glass. Thereby, the conductive powder may be diffused into the semiconductor substrate, and the conductive powder diffused into the semiconductor substrate may be recrystalized to provide a relatively large amount of recrystalized conductive particles.

Thereby, the recrystalized conductive particles produced on the surface of the semiconductor substrate may effectively transfer a charge generated by solar light from the semiconductor substrate to the electrode, thereby increasing the efficiency of the solar cell.

In order to provide a solid solution of the conductive powder and the metallic glass, the conductive powder and the metallic glass may be co-melted at a lower temperature than the baking temperature of the conductive paste.

According to example embodiments, a third element having a eutectic temperature with the conductive powder lower than the baking temperature of the conductive paste may be included, thereby providing a solid solution of the conductive powder and the metallic glass. The conductive paste has a baking temperature of about 1000° C. or less, for example, about 200° C. to about 950° C., so the third element may be selected from elements having a lower eutectic temperature than the conductive powder.

The third element has an absolute value of Gibbs free energy of oxide formation of about 1000 kJ/mol or less in the baking temperature of the conductive paste. When the third element has the aforementioned absolute value of Gibbs free energy of oxide formation, the oxidizing property may be relatively stable. On the other hand, the Gibbs free energy difference of oxide formation of the second element and the third element may be about 300 kJ/mol or higher.

The Gibbs free energy difference of oxide formation of two different elements allows for similar oxidizing properties when exposed to air. When the Gibbs free energy difference of oxide formation between the second element and the third element is less than about 300 kJ/mol, the second element may be oxidized together with the third element when exposed to air. In example embodiments, two oxides having different structures are formed, and oxygen in the air may more easily flow in through the phase boundary between these oxides to deteriorate the oxidation resistance of the metallic glass.

For reference, Table 1 shows the Gibbs free energy of oxide formation of various elements.

TABLE 1

| Element | Oxidation reaction | Gibbs free energy of oxide formation (kJ/mole $O_2$) |
|---|---|---|
| Cu | $4Cu + O_2 \rightarrow 2Cu_2O$ | 292 |
| Sn | $Sn + O_2 \rightarrow SnO_2$ | 515.8 |
| Zn | $2Zn + O_2 \rightarrow 2ZnO$ | 641 |
| Zr | $Zr + O_2 \rightarrow ZrO_2$ | 1042.8 |
| Al | $4/3Al + O_2 \rightarrow 2/3Al_2O_3$ | 1054.9 |

For example, the conductive powder may be silver (Ag), the first element may be copper (Cu), the second element may be zirconium (Zr), and the third element may be aluminum (Al), which will be described in detail hereinafter.

The eutectic temperature of aluminum (Al) and silver (Ag) is about 567° C., so the two elements may be co-melted to provide a solid solution at a lower temperature than the baking temperature of the conductive paste.

On the other hand, the Gibbs free energy difference of oxide formation of between zirconium (Zr) and aluminum (Al) at the baking temperature of conductive paste ranges from about 100 kJ/mol to about 200 kJ/mol, which allows for similar oxidizing properties therebetween.

While baking the conductive paste, zirconium (Zr) forms a monoclinic zirconium oxide (monoclinic $ZrO_2$). Aluminum (Al) may be simultaneously oxidized with zirconium (Zr) since aluminum (Al) has a similar oxidizing property to zirconium (Zr). The metallic glass may simultaneously form zirconium oxide ($ZrO_2$) and aluminum oxide ($Al_2O_3$).

However, in example embodiments, zirconium oxide ($ZrO_2$) may generate a plurality of oxygen vacancies in the structure by aluminum oxide ($Al_2O_3$). Thereby, tetragonal zirconium oxide may be provided by the oxygen vacancy. By increasing the process temperature, the tetragonal zirconium oxide may be phase-transited to a monoclinic zirconium oxide. Thereby, the tetragonal zirconium oxide and the monoclinic zirconium oxide may co-exit, and oxygen in the air may more easily flow in through a phase boundary therebetween to increase the entire oxidation of the metallic glass.

Accordingly, the third element may be selected from components that are capable of providing a solid solution with the conductive powder without affecting the oxidation resistance of the metallic glass.

When the second element is, for example, zirconium (Zr), the third element may be, for example, zinc (Zn), tin (Sn), antimony (Sb), bismuth (Bi), cadmium (Cd), thallium (Tl), germanium (Ge), indium (In), gallium (Ga) and/or a combination thereof.

For example, the first element is a low resistance element determining the conductivity of the metallic glass and may be selected from metals having relatively lower resistivity than other elements. The second element may be selected from elements having a higher oxidizing property than the first element for preventing or inhibiting the first element from being oxidized, and the third element may be selected from elements that are capable of providing a solid solution with the conductive powder without suppressing the oxidation resistance of the second element.

For example, the conductive powder may include silver (Ag), the first element may include copper (Cu), the second element may include zirconium (Zr), and the third element may include zinc (Zn), tin (Sn), antimony (Sb), bismuth (Bi), cadmium (Cd), thallium (Tl), germanium (Ge), indium (In), gallium (Ga) and/or a combination thereof. The metallic glass may further include other components in addition to the first, second, and third elements.

The organic vehicle may include an organic compound mixed with the conductive powder and the metallic glass to impart viscosity to the organic vehicle. A solvent that can dissolve the foregoing components may also be included.

The organic compound may include, for example, at least one selected from (meth)acrylate-based resin, a cellulose resin such as ethyl cellulose, a phenol resin, an alcohol resin, tetrafluoroethylene (TEFLON®) and/or a combination thereof, and may further include an additive such as a surfactant, a thickener and/or a stabilizer.

The solvent may be any solvent that is capable of dissolving the above compounds, and may include, for example, at least one selected from terpineol, butylcarbitol, butylcarbitol acetate, pentanediol, dipentyne, limonene, ethylene glycol alkylether, diethylene glycol alkylether, ethylene glycol alkylether acetate diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid and/or desalted water.

The conductive powder, the metallic glass, and the organic vehicle may be included in respective amounts of about 30 wt % to about 99 wt %, about 0.1 wt % to about 20 wt %, and about 0.9 to about 69.9 wt %, or more specifically, about 40 to about 98 wt %, about 1 to about 20 wt %, and about 1 to about 59 wt %, or even more specifically about 40 to about 95 wt %, about 2 to about 20 wt %, and about 3 to about 58 wt %, or even further specifically about 50 to about 90 wt %, about 4 to about 20 wt %, and about 6 to about 46 wt %, respectively, based on the total weight of the conductive paste.

The conductive paste may be disposed by screen printing to provide an electrode for an electronic device. For example, when the electrode is manufactured by applying a conductive paste on the semiconductor substrate, the conductive powder may form a solid solution with the third element of the metallic glass and may be diffused into the melted metallic glass as described above.

Example embodiments will now be described with reference to FIGS. 1A to 1D. FIGS. 1A to 1D are cross-sectional views schematically showing a conductive structure according to example embodiments including a conductive powder that forms a solid solution with and diffuses into a metallic glass.

Referring to FIG. 1A, a conductive structure 100 may include a conductive paste 120a applied on a semiconductor substrate 110. The conductive paste 120a may include a conductive powder 122a and a metallic glass 115a, which are each separately present as particles.

Figure 1B:
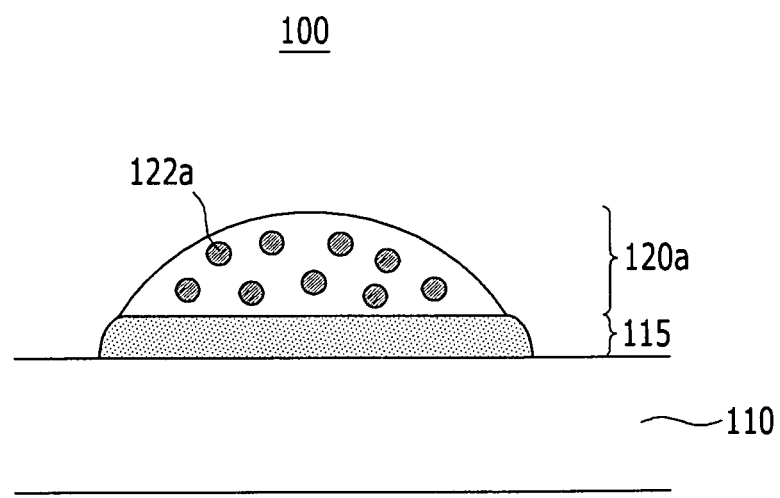

Referring to FIG. 1B, when the conductive structure 100 is heated above the glass transition temperature ($T_g$) of the metallic glass 115a, the metallic glass 115a may soften and demonstrate the behavior of a liquid. The softened metallic glass 115a may demonstrate wettability on the semiconductor substrate 110 to provide a buffer layer 115. The buffer layer 115 may closely contact a relatively wide area of the semiconductor substrate 110. Because the metallic glass 115a has a lower glass transition temperature ($T_g$) than the baking temperature of the conductive powder 122a, the conductive powder 122a may still be present as particles in the conductive paste 120a. Thereby, the electrode prepared by using the conductive paste may include a buffer layer positioned at a region which is adjacent to the semiconductor substrate, and an electrode portion positioned at a region other than a region where the buffer layer is formed, for example, on the buffer layer.

Figure 1C:
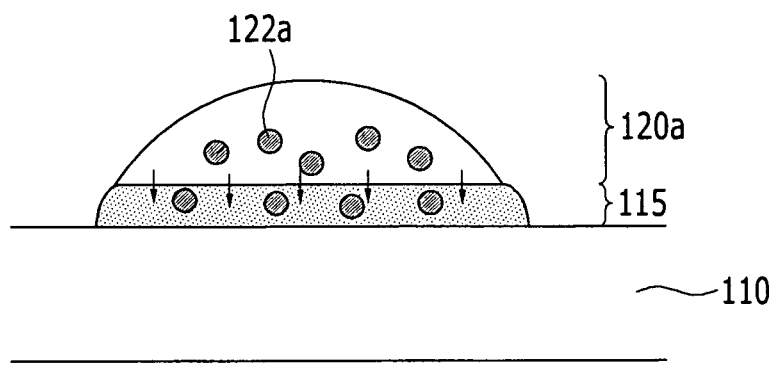

Referring to FIG. 1C, when the conductive structure 100 is heated above the eutectic temperature of the conductive powder 122a and the metallic glass present in the buffer layer 115, the conductive powder 122a may be co-melted with the metallic glass. A portion of the conductive powder 122a may also form a solid solution with the metallic glass and be diffused into the buffer layer 115.

Figure 1D:
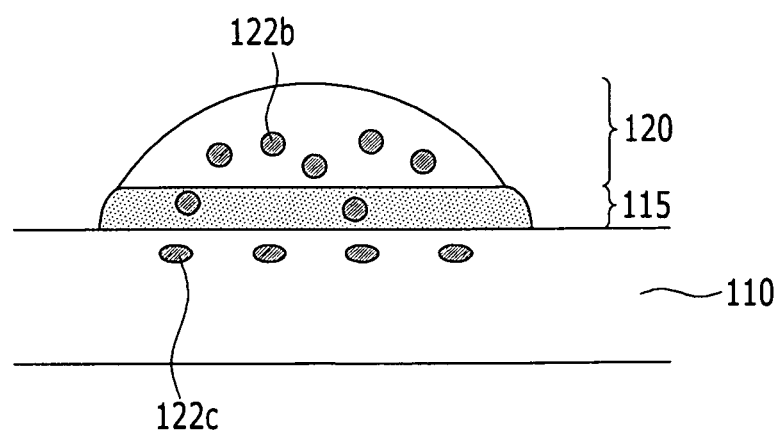

Referring to FIG. 1D, a portion of the conductive powder 122a (see FIG. 1C) diffused into the buffer layer 115 may be diffused into the semiconductor substrate 110 and/or the interface of the semiconductor substrate 110 and the buffer layer 115. When the semiconductor substrate 110 is cooled, the conductive powder may be recrystallized to provide a front electrode portion 120 including a first conductive powder 122b that is crystallized, and the second conductive powder 122c that permeated into the semiconductor substrate 110 may also be recrystallized.

Accordingly, the front electrode portion 120 including the first conductive powder 122b is formed, and the buffer layer 115 including the metallic glass may be formed between the front electrode portion 120 and the semiconductor substrate 110. The second conductive powder 122c may permeate into the semiconductor substrate 110 and be recrystallized.

The second conductive powder 122c present in the semiconductor substrate 110 may effectively transfer a charge generated in the semiconductor substrate 110 by solar light to the front electrode portion 120 through the buffer layer 115, and simultaneously decrease contact resistance between the semiconductor substrate 110 and the front electrode portion 120 to thereby decrease charge loss and enhance efficiency in a solar cell.

Figure 2:
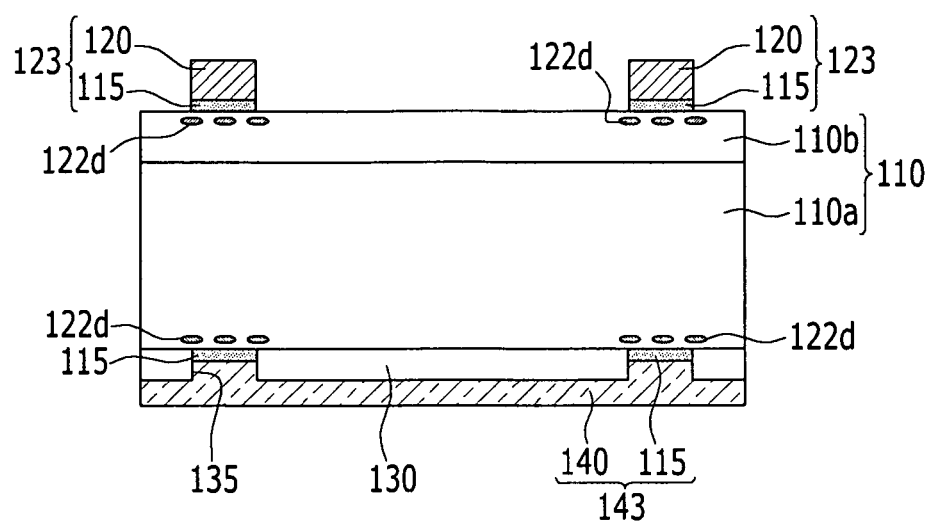
FIGS. 2-3 are cross-sectional views illustrating a solar cell according to example embodiments.

Referring to FIG. 2, a solar cell according to example embodiments is disclosed in further detail. FIG. 2 is a cross-sectional view showing a solar cell according to example embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, the spatial relationship of components will be described with respect to a semiconductor substrate 110 for better understanding and ease of description, but example embodiments are not limited thereto. In addition, a solar energy incident side of a semiconductor substrate 110 is termed a front side, and the opposite side is called a rear side, although alternative configurations of example embodiments are possible.

Referring to FIG. 2, a solar cell 200 according to example embodiments may include a semiconductor substrate 110 including a lower semiconductor layer 110a and an upper semiconductor layer 110b.

The semiconductor substrate 110 may include crystalline silicon or a compound semiconductor. The crystalline silicon may be, for example, a silicon wafer. Either of the lower semiconductor layer 110a and the upper semiconductor layer 110b may be a semiconductor layer doped with a p-type impurity, while the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element, e.g., boron (B), and the n-type impurity may be a Group V element, e.g., phosphorus (P).

The surface of the upper semiconductor layer 110b may be textured by a surface texturing process. The surface-textured upper semiconductor layer 110b may have protrusions and depressions, may include a pyramidal shape, or may have a porous structure having a honeycomb shape, for example.

The surface-textured upper semiconductor layer 110b may have an enhanced surface area to improve the light-absorption rate and decrease reflectivity, thereby improving efficiency of a solar cell.

A plurality of front electrodes 123 may be disposed on the upper semiconductor layer 110b. The plurality of front electrodes 123 may be arranged in parallel to the direction of the substrate 110, and may have a grid pattern shape to reduce shadowing loss and sheet resistance.

Each of the plurality of front electrodes 123 may include a buffer layer 115 positioned at a region which is adjacent to the upper semiconductor layer 110b, and the front electrode portion 120 positioned at a region other than a region where the buffer layer 115 is formed and including a conductive material. FIG. 2 shows that the buffer layer 115 is formed on the upper semiconductor layer 110b, but is not limited thereto. The buffer layer 115 may be omitted, or may be formed on a separate part of the upper semiconductor layer 110b.

The front electrode may be formed by a screen printing method using a conductive paste. The conductive paste is the same as described above. The front electrode portion 120 may include a conductive material, for example, at least one of silver (Ag), aluminum (Al), copper (Cu), nickel (Ni), and/or a combination thereof.

A buffer layer 115 may be disposed between the upper semiconductor layer 110b and the front electrode portion 120. The buffer layer 115 may be conductive due to inclusion of a metallic glass. Because the buffer layer 115 has portions that contact the front electrode portion 120 and the upper semiconductor layer 110b, the buffer layer 115 may decrease loss of electric charges by improving a path for transferring the electric charges between the upper semiconductor layer 110b and the front electrode portion 120.

The metallic glass of the buffer layer 115 is derived from the conductive paste used to form the front electrode portion 120. The metallic glass may melt before the conductive material of the front electrode portion 120 during processing, so that the metallic glass is disposed under the front electrode portion 120.

The buffer layer 115, the upper semiconductor layer 110b disposed under the buffer layer 115 and/or the interface of the upper semiconductor layer 110b include the crystallized conductive material 122d. The crystallized conductive material 122d may be fused during the baking process to form the front electrode using the conductive paste. The crystallized conductive material 122d passes through the buffer layer 115, diffuses into the upper semiconductor layer 110b and is recrystallized. The crystallized conductive material 122d may decrease the contact resistance between the upper semiconductor layer 110b and the front electrode portion 120 together with the buffer layer 115 and improve the electrical characteristics of the solar cell.

A bus bar electrode (not shown) may be disposed on the front electrode portion 120. The bus bar electrode may connect adjacent solar cells of a plurality of solar cells.

A dielectric layer 130 may be disposed under the semiconductor substrate 110. The dielectric layer 130 may increase efficiency of a solar cell by substantially or effectively preventing or inhibiting recombination of electric charges and leaking of electric current. The dielectric layer 130 may include a through-hole 135. A rear electrode 143, which is further disclosed below, may contact the semiconductor substrate 110 through the through-hole 135.

The dielectric layer 130 may include silicon oxide ($SiO_2$), silicon nitride ($SiN_x$), aluminum oxide ($Al_2O_3$) and/or a combination thereof, and may have a thickness of about 100 Å to about 2000 Å.

A rear electrode 143 may be disposed under the dielectric layer 130. The rear electrode 143 may include a conductive material, for example, an opaque metal, e.g., aluminum (Al). The rear electrode 143 may be formed by a screen printing method using a conductive paste in the same manner as the plurality of front electrodes 123.

The rear electrode 143 may include a buffer layer 115 positioned at a region which is adjacent to the lower semiconductor layer 110a, and a rear electrode portion 140 positioned at a region other than a region where the buffer layer 115 is formed and including a conductive material in the same manner as the plurality of front electrodes 123. However, example embodiments are not limited thereto. The buffer layer 115 may be omitted, or may be formed on a part of the lower semiconductor layer 110a.

The buffer layer 115, the lower semiconductor layer 110a disposed on the buffer layer 115 and/or the interface of the lower semiconductor layer 110a include the crystallized conductive material 122d. The crystallized conductive material 122d may be fused during the baking process to form the rear electrode using the conductive paste. The crystallized conductive material 122d passes through the buffer layer 115, diffuses into the lower semiconductor layer 110a and recrystallized. The crystallized conductive material 122d may decrease the contact resistance between the lower semiconductor layer 110a and the rear electrode portion 140 together with the buffer layer 115 and improve the electrical characteristics of the solar cell.

Hereinafter, a method of manufacturing the solar cell is further disclosed with reference to FIG. 2. A semiconductor substrate 110, which may be a silicon wafer, for example, is prepared. The semiconductor substrate 110 may be doped with a p-type impurity, for example.

The semiconductor substrate 110 may be subjected to a surface-texturing treatment. The surface-texturing treatment may be performed by a wet method using a strong acid, e.g., nitric acid or hydrofluoric acid, or a strong base, e.g., sodium hydroxide, or by a dry method, e.g., a plasma treatment.

The semiconductor substrate 110 may be doped with an n-type impurity, for example. The n-type impurity may be doped by diffusing $POCl_3$ or $H_3PO_4$ at a higher temperature. The semiconductor substrate 110 may include a lower semiconductor layer 110a and an upper semiconductor layer 110b doped with different impurities from each other.

A conductive paste for a front electrode is applied on the upper semiconductor layer 110b. The conductive paste for a front electrode may be provided by a screen printing method. The screen printing method includes applying the conductive paste, which includes a conductive powder, a metallic glass, and an organic vehicle, on a surface where a front electrode is disposed and drying the same.

As further disclosed above, the conductive paste may include a metallic glass. The metallic glass may be prepared using any method, e.g., melt spinning, infiltration casting, gas atomization, ion irradiation, or mechanical alloying.

Then, the conductive paste for a front electrode may be dried. A dielectric layer 130 may be provided by laminating aluminum oxide (e.g., $Al_2O_3$) or silicon oxide (e.g., $SiO_2$) on the rear side of the semiconductor substrate 110, for example, in a plasma enhanced chemical vapor deposition ("PECVD") method. A plurality of through-holes 135 may be provided on a portion of the dielectric layer 130 by using a laser, for example.

The conductive paste for a rear electrode may be subsequently applied on a side of the dielectric layer 130 by a screen printing method. The conductive paste for a rear electrode may then be dried.

The conductive pastes for the front and rear electrodes may be fired either in sequence or simultaneously. The firing may be performed at a higher temperature than the melting temperature of the conductive metal in a furnace, for example, at a temperature ranging from about 200° C. to about 1000° C.

Figure 3:
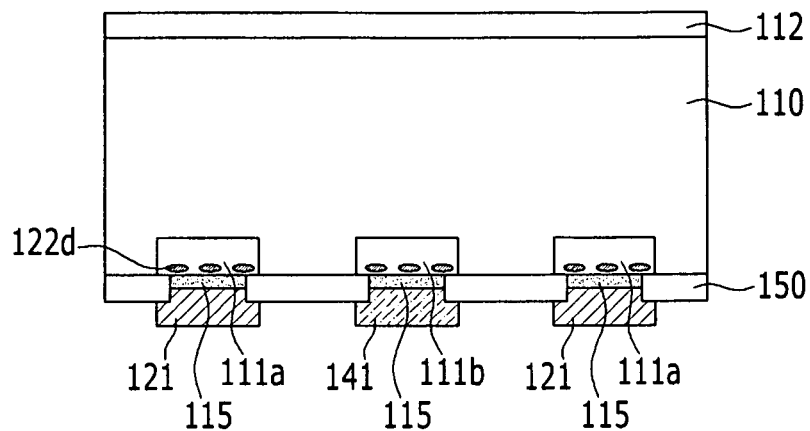

Hereinafter, a solar cell according to example embodiments is disclosed referring to FIG. 3. FIG. 3 is a cross-sectional view showing a solar cell according to example embodiments.

A solar cell 300 may include a semiconductor substrate 110 doped with a p-type or an n-type impurity. The semiconductor substrate 110 may include a plurality of first doping regions 111a and second doping regions 111b on the rear side of the semiconductor substrate 110 and may be doped with different impurities from each other. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured, and therefore may enhance the light-absorption rate and decrease the reflectivity, thereby improving efficiency of a solar cell. An insulation layer 112 is provided on the semiconductor substrate 110. The insulation layer 112 may include an insulating material that absorbs relatively little light, for example, at least one of silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), and/or a combination thereof. The insulation layer 112 may be a single layer or more than one layer. The insulation layer 112 may have a thickness ranging from about 200 to about 1500 Å.

The insulation layer 112 may be an anti-reflective coating ("ARC") that decreases the reflectivity of light and increases selectivity of a particular wavelength on the surface of the solar cell, and simultaneously improves properties of silicon on the surface of the semiconductor substrate 110, thereby increasing efficiency of the solar cell.

A dielectric layer 150 including a plurality of through-holes may be disposed on the rear side of the semiconductor substrate 110. The first electrode electrically connected with the first doping region 111a and the second electrode electrically connected with the second doping region 111b may be disposed on the rear side of the semiconductor substrate 110, respectively. The first electrode and the first doping region 111a may be in contact through a through-hole, and the second electrode and the second doping region 111b may be in contact through a through-hole. The first electrode and the second electrode may be alternately disposed.

The first electrode may include a buffer layer 115 positioned at a region which is adjacent to the first doping region 111a, and a first electrode portion 121 positioned at a region other than a region where the buffer layer 115 is formed. The second electrode may include a buffer layer 115 positioned at a region which is adjacent to the second doping region 111b, and a second electrode portion 142 positioned at a region other than a region where the buffer layer 115 is formed. However, example embodiments are not limited thereto. The buffer layer 115 may be omitted, or may be formed on a portion of a region adjacent to the first doping region 111a, a portion of region adjacent to the second doping region 111b, and/or or a combination thereof.

As disclosed in example embodiments, the first electrode and the second electrode may be disposed using a conductive paste including a conductive powder, a metallic glass, and an organic vehicle, which is the same as described above.

A buffer layer 115 may be disposed between the first doping region 111a and the first electrode portion 121, or between the second doping region 111b and the second electrode portion 141. The buffer layer 115 may be electrically conductive due to the inclusion of a metallic glass. Because the buffer layer 115 includes portions contacting either the first electrode portion 121 or the second electrode portion 141, and portions contacting either the first doping region 111a or the second doping region 111b, respectively, undesirable loss of electric charge may be decreased by improving the path for transferring the electric charge between the first doping region 111a and the first electrode portion 121, or between the second doping region 111b and the second electrode portion 141.

In addition, a crystallized conductive material 122d may be included in at least one of the buffer layer 115, the first doping region 111a, the second doping region 111b, the interface of the first doping region 111a of the semiconductor substrate 110 and buffer layer 115, and the interface of the buffer layer 115 and the second doping region 111b of the semiconductor substrate 110. A baking process may be performed on the crystallized conductive material 122d while providing a first electrode and/or a second electrode in the baking process such that the crystallized conductive material 122d passes through the buffer layer 115, diffuses into the first doping region 111a and/or the second doping region 111b of the semiconductor substrate 110 and then recrystallizes. The crystallized conductive material 122d may decrease the contact resistance between the first doping region 111a and the first electrode portion 121 and between the second doping region 111b and the second electrode portion 141 together with the buffer layer and improve the electrical characteristics of the solar cell.

A solar cell according to example embodiments including both the first electrode and the second electrode on the rear surface of the solar cell may decrease an area where a metal is disposed on the front surface, thereby resulting in decreased shadowing loss and increased solar cell efficiency.

Hereinafter, the method of manufacturing a solar cell 300 will be further disclosed referring to FIG. 3. A semiconductor substrate 110 doped with, for example, an n-type impurity is prepared. The semiconductor substrate 110 may be surface-textured, and the insulation layer 112 and the dielectric layer 150 may be disposed on the front side and the rear side of the semiconductor substrate 110, respectively. The insulation layer 112 and the dielectric layer 150 may be provided by chemical vapor deposition ("CVD"), for example.

The first doping region 111a and the second doping region 111b may be disposed by sequentially doping a p-type impurity and an n-type impurity at a higher concentration on the rear side of the semiconductor substrate 110.

A conductive paste for a first electrode may then be applied on a portion of the dielectric layer 150 corresponding to the first doping region 111a, and a conductive paste for a second electrode may be applied on a portion of the dielectric layer 150 corresponding to the second doping region 111b. The conductive paste for the first electrode and the conductive paste for the second electrode may be disposed by a screen printing method, for example, wherein the conductive paste may include a conductive powder, a metallic glass, and an organic vehicle.

The conductive paste for the first electrode and the conductive paste for the second electrode may be fired in sequence or simultaneously. The firing may be performed in a furnace at a temperature that is higher than the melting temperature of a conductive metal in a furnace.

In example embodiments, the conductive paste is applied to provide an electrode for a solar cell, but may be used for an electrode for other electronic devices.

The following examples illustrate this disclosure in further detail. However, it is understood that this disclosure shall not be limited by these examples.

Oxidizing Property Assessment of Metallic Glass

Example 1

A metallic glass ($Cu_{49}Zr_{49}Zn_2$) ribbon is prepared by using a melt spinner, and the metallic glass is cut into a size of about 5 mm×5 mm. The metallic glass segment is introduced into a thermogravimetric analyzer and heated to about 800° C. at a speed of about 10° C./min, and a weight change according to temperature is measured.

Example 2

The weight change according to temperature is measured in accordance with the same procedure as in Example 1, except that $Cu_{48}Zr_{48}Zn_4$ is used as a metallic glass instead of $Cu_{49}Zr_{49}Zn_2$.

Example 3

The weight change according to temperature is measured in accordance with the same procedure as in Example 1, except that $Cu_{46}Zr_{46}Zn_8$ is used as a metallic glass instead of $Cu_{49}Zr_{49}Zn_2$.

Comparative Example 1

The weight change according to temperature is measured in accordance with the same procedure as in Example 1, except that $Cu_{50}Zr_{50}$ is used as a metallic glass instead of $Cu_{49}Zr_{49}Zn_2$.

Comparative Example 2

The weight change according to temperature is measured in accordance with the same procedure as in Example 1, except that $Cu_{46}Zr_{46}Al_8$ is used as a metallic glass instead of $Cu_{49}Zr_{49}Zn_2$.

Assessment 1

Each weight change according to the temperature of metallic glasses according to Examples 1 to 3 and Comparative Examples 1 and 2 is described with reference to FIG. 4.

Figure 4:
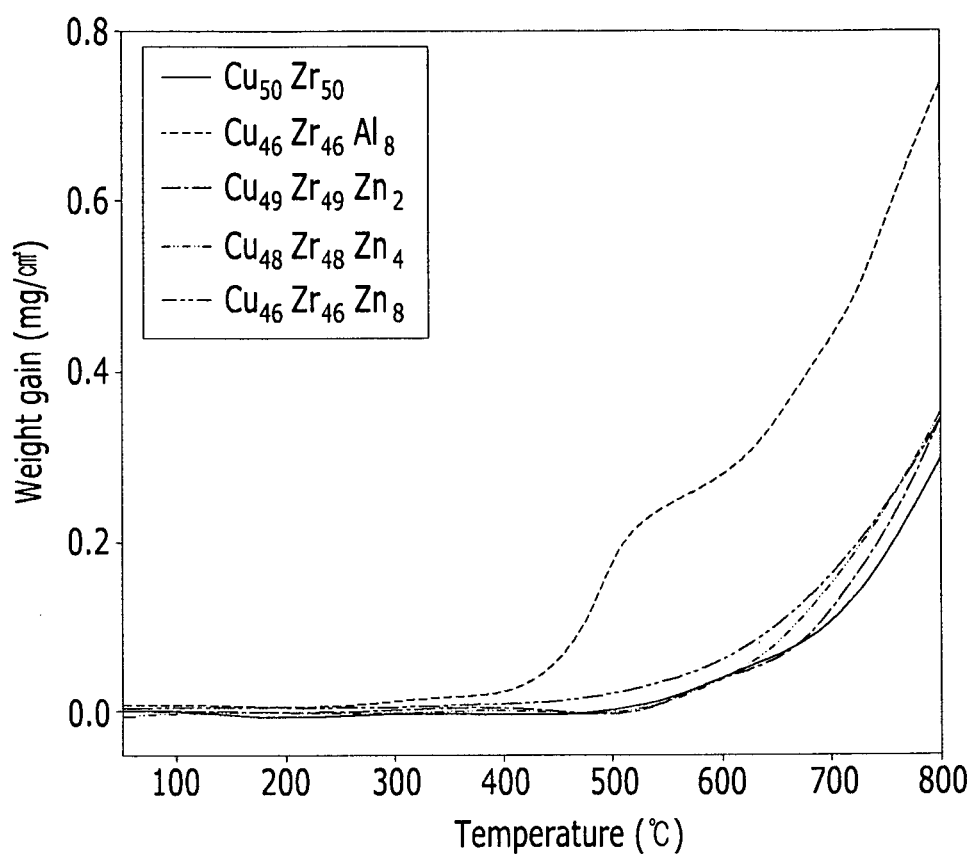
FIG. 4 is a graph showing a weight change according to temperature of metallic glass according to Examples 1 to 3 of example embodiments and Comparative Examples 1 and 2.

FIG. 4 is a graph showing the weight change according to the temperature of metallic glass according to Examples 1 to 3 of example embodiments and Comparative Examples 1 and 2.

Referring to FIG. 4, the metallic glass according to Examples 1 to 3 have similar weight changes compared to the metallic glass according to Comparative Example 1, and neither the entire oxidizing property of the metallic glass nor the oxidation of zirconium (Zr) may be affected even in the case of further including zinc (Zn).

On the other hand, the metallic glass according to Comparative Example 2 has an increased weight in a range of about 500° C. to about 800° C., which means that the entire oxidizing degree of the metallic glass is increased according to the increase in temperature. Because the metallic glass includes aluminum (Al), the entire oxidation degree of metallic glass may increase.

Measurement of Solid Solubility of Conductive Powder

Example 4

A metallic glass of $Cu_{49}Zr_{49}Sn_2$ is prepared as a ribbon having a thickness of about 90 μm and a width of about 0.5 cm. The metallic glass ribbon is cut to provide a length of 1 cm, and is coated with a silver (Ag) paste including 85 wt % of silver (Ag). The metallic glass ribbon is heated to about 650° C. for about 30 minutes and exposed to air to provide a conductive thin film. The heating speed is about 50° C./min.

Comparative Example 3

A conductive thin film is provided on the metallic glass ribbon in accordance with the same procedure as in Example 4, except that $Cu_{50}Zr_{50}$ is used as a metallic glass instead of $Cu_{49}Zr_{49}Sn_2$.

Assessment 2

The metallic glass ribbons and conductive thin films obtained from Example 4 and Comparative Example 3 are cut and analyzed to determine the cross-sections thereof.

Table 2 shows the solid solubility of silver (Ag) present in the metallic glass ribbon positioned about 3 μm from the interface between the metallic glass ribbons and the conductive thin film obtained from Example 4 and Comparative Example 3. The silver (Ag) solid solubility is determined by measuring silver (Ag) concentration (at %) in a depth of 3 μm through energy dispersive x-ray spectroscopy (EDS) of the interface between the metallic glass ribbon and the conductive thin film.

TABLE 2

| | Silver (Ag) solid solubility (at %) |
|---|---|
| Example 4 | 11.5 |
| Comparative Example 3 | 3.7 |

Referring to Table 2, the silver (Ag) amount present in the metallic glass ribbon obtained from Example 4 is greater than about 3 times or more that of the silver (Ag) amount present in the metallic glass ribbon obtained from Comparative Example 3. Thereby, it is understood that the metallic glass ribbon obtained from Example 4 further includes the third element of tin (Sn), so the solid solubility of silver (Ag) may be further increased.

Manufacture of Conductive Paste and Electrode

Example 5

Silver (Ag) powder and metallic glass of $Cu_{49}Zr_{49}Sn_2$ are added to an organic vehicle including an ethyl cellulose binder and a butyl carbitol solvent. The silver (Ag) powder, the metallic glass of $Cu_{49}Zr_{49}Sn_2$, and the organic vehicle are mixed at about 84 wt %, about 4 wt %, and about 12 wt % based on the total amount of conductive paste, respectively, and kneaded by using a 3-roll mill to provide a conductive paste.

The conductive paste may be coated on the silicon wafer according to a screen printing method, rapidly heated to about 500° C. in a belt furnace and then slowly heated to about 900° C. Then, the conductive paste is cooled to provide an electrode.

Comparative Example 4

A conductive paste and an electrode are provided in accordance with the same procedure as in Example 5, except that $Cu_{50}Zr_{50}$ is used instead of $Cu_{49}Zr_{49}Sn_2$ as a metallic glass.

Assessment 3

The electrodes obtained from Example 5 and Comparative Example 4 are measured for contact resistance. The contact resistance is measured by a transfer length method (TLM).

Table 3 shows the contact resistance of electrodes obtained from Example 5 and Comparative Example 4.

TABLE 3

|  | Contact resistance ($m\Omega/cm^2$ at $100\Omega$ (sheet resistance)) |
| --- | --- |
| Example 5 | 9.85 |
| Comparative Example 4 | 31.28 |

Referring to Table 3, it is understood that the electrode obtained from Example 5 has lower contact resistance than the electrode obtained from Comparative Example 4. Thereby, it is understood that the contact resistance may be decreased because the metallic glass including tin (Sn) is capable of increasing the solid solubility with silver (Ag). In addition, the contact resistance may be further decreased by using the metallic glass including the further increased amount of tin (Sn) because the solid solubility with silver (Ag) may be further increased.

The solar cell is described as one example above, but the conductive paste is not limited to the solar cell, and may be used for forming an electrode of various electronic devices, e.g., a PDP, an LCD, or an OLED.

While this disclosure has been described in connection with what is presently considered to be practical example embodiments, it is to be understood that the inventive concepts are not limited to the disclosed embodiments, but, on the contrary, are intended to cover various modifications and equivalent arrangements included within the spirit and scope of the appended claims.

What is claimed is:

1. A conductive paste comprising;
    a conductive powder, a metallic glass, and an organic vehicle,
    wherein the metallic glass is an alloy having a disordered atomic structure and including a first element, a second element and a third element,
    the second element having a higher absolute value of Gibbs free energy of oxide formation than the first element, and
    the third element having an absolute value of Gibbs free energy of oxide formation of about 1000 kJ/mol or less at a baking temperature and a eutectic temperature with the conductive powder of less than about 1000° C.

2. The conductive paste of claim 1, wherein the Gibbs free energy difference of oxide formation between the second element and the third element is about 300 kJ/mol or more.

3. The conductive paste of claim 1, wherein the first element has a lower resistivity than the second element and the third element.

4. The conductive paste of claim 1, wherein the second element is present as an oxide while baking the conductive paste.

5. The conductive paste of claim 4, wherein the third element comprises at least one of zinc (Zn), tin (Sn), antimony (Sb), bismuth (Bi), cadmium (Cd), thallium (Tl), germanium (Ge), indium (In), gallium (Ga), or a combination thereof.

6. The conductive paste of claim 1, wherein the third element has an eutectic temperature with the conductive powder of about 200° C. to about 950° C.

7. The conductive paste of claim 1, wherein the conductive paste has a baking temperature of about 1000° C. or less.

8. The conductive paste of claim 1, wherein the conductive powder comprises at least one of silver (Ag), aluminum (Al), copper (Cu), nickel (Ni), and a combination thereof.

9. The conductive paste of claim 1, wherein the first element comprises copper (Cu), and the second element comprises zirconium (Zr).

10. The conductive paste of claim 1, wherein the conductive powder, the metallic glass, and the organic vehicle are included at about 30 wt % to about 99 wt %, about 0.1 wt % to about 20 wt %, and about 0.9 to about 69.9 wt % based on the total amount of the conductive paste, respectively.

11. An electronic device comprising an electrode formed using the conductive paste according to claim 1.

12. A solar cell comprising:
    an electrode electrically connected with a semiconductor layer, the electrode formed using the conductive paste according to claim 1.

13. The solar cell of claim 12, wherein a Gibbs free energy difference of oxide formation between the second element and the third element is about 300 kJ/mol or more.

14. The solar cell of claim 12, wherein the first element has lower resistivity than the second element and the third element.

15. The solar cell of claim 12, wherein the first element comprises copper (Cu), and
    the second element comprises zirconium (Zr).

16. The solar cell of claim 15, wherein the third element comprises at least one of zinc (Zn), tin (Sn), antimony (Sb), bismuth (Bi), cadmium (Cd), thallium (Tl), germanium (Ge), indium (In), gallium (Ga), and a combination thereof.

17. The solar cell of claim 12, wherein the electrode comprises:
    a buffer layer at a region adjacent to the semiconductor layer, and
    an electrode portion at another region different from a region where the buffer layer is formed.

18. The solar cell of claim 17, wherein the second element in the buffer layer is present as an oxide.

19. The solar cell of claim 17, wherein the conductive material comprises at least one of silver (Ag), aluminum (Al), copper (Cu), nickel (Ni), and a combination thereof.

20. The solar cell of claim 17, wherein at least one of the buffer layer, the interface of the semiconductor layer and the buffer layer, and the semiconductor layer comprise a crystallized conductive material.

* * * * *